(12) United States Patent
Frohberg et al.

(10) Patent No.: US 9,269,809 B2
(45) Date of Patent: Feb. 23, 2016

(54) METHODS FOR FORMING PROTECTION LAYERS ON SIDEWALLS OF CONTACT ETCH STOP LAYERS

(71) Applicant: GLOBALFOUNDRIES Inc., Grand Cayman (KY)

(72) Inventors: Kai Frohberg, Niederau (DE); Marco Lepper, Dresden (DE); Katrin Reiche, Goltzscha (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/184,826

(22) Filed: Feb. 20, 2014

(65) Prior Publication Data

US 2014/0264641 A1 Sep. 18, 2014

Related U.S. Application Data

(60) Provisional application No. 61/783,207, filed on Mar. 14, 2013.

(51) Int. Cl.
| H01L 21/00 | (2006.01) |
| H01L 29/78 | (2006.01) |
| H01L 29/417 | (2006.01) |
| H01L 23/485 | (2006.01) |
| H01L 21/768 | (2006.01) |

(52) U.S. Cl.
CPC ...... *H01L 29/7833* (2013.01); *H01L 21/76805* (2013.01); *H01L 21/76814* (2013.01); *H01L 21/76843* (2013.01); *H01L 23/485* (2013.01); *H01L 29/4175* (2013.01); *H01L 2924/00* (2013.01); *H01L 2924/0002* (2013.01)

(58) Field of Classification Search
CPC ............... H01L 21/76844; H01L 29/4175; H01L 29/7833; H01L 23/485; H01L 21/76805; H01L 21/76814; H01L 2924/0002; H01L 2924/76843; H01L 2924/00
See application file for complete search history.

(56) References Cited

U.S. PATENT DOCUMENTS

| 6,528,409 B1 * | 3/2003 | Lopatin et al. ............... 438/618 |
| 2010/0090321 A1 * | 4/2010 | Mulfinger et al. ............ 257/632 |
| 2011/0266638 A1 * | 11/2011 | Frohberg et al. ............. 257/412 |
| 2012/0248551 A1 * | 10/2012 | Baars et al. .................. 257/412 |

* cited by examiner

*Primary Examiner* — Kimberly Rizkallah
*Assistant Examiner* — Alexander Belousov
(74) *Attorney, Agent, or Firm* — Amerson Law Firm, PLLC (57) ABSTRACT

When forming semiconductor devices with contact plugs comprising protection layers formed on sidewalls of etch stop layers to reduce the risk of shorts, the protection layers may be formed by performing a sputter process to remove material from a contact region and redeposit the removed material on the sidewalls of the etch stop layers.

23 Claims, 7 Drawing Sheets

METHODS FOR FORMING PROTECTION LAYERS ON SIDEWALLS OF CONTACT ETCH STOP LAYERS

BACKGROUND OF THE INVENTION

1. Field of the Invention

Generally, the present disclosure relates to the field of semiconductor manufacturing, and, more particularly, to the formation of contact structures connecting circuit elements to interconnect structures of the first metallization level.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density, also increases, thereby requiring an even larger increase in the number of electrical connections to provide the desired circuit functionality, since the number of mutual connections between the circuit elements typically increases in an over-proportional way compared to the number of circuit elements. Therefore, the number of stacked metallization layers usually increases as the number of circuit elements per chip area becomes larger, while nevertheless the sizes of individual metal lines and vias are reduced. Due to the moderately high current densities that may be encountered during the operation of advanced integrated circuits, and owing to the reduced feature size of metal lines and vias, semiconductor manufacturers are increasingly replacing the well-known metallization materials, such as aluminum, by a metal that allows higher current densities and, hence, permits a reduction in the dimensions of the interconnections. Consequently, copper and alloys thereof are materials that are increasingly used in the fabrication of metallization layers due to the superior characteristics in view of resistance against electromigration and the significantly lower electrical resistivity compared to, for instance, aluminum. Despite these advantages, copper also exhibits a number of disadvantages regarding the processing and handling of copper in a semiconductor facility. For instance, copper readily diffuses in a plurality of well-established dielectric materials, such as silicon dioxide, wherein even minute amounts of copper, accumulating at sensitive device regions, such as contact regions of transistor elements, may lead to a failure of the respective device. For this reason, great efforts have to be made so as to reduce or avoid any copper contamination during the fabrication of the transistor elements, thereby rendering copper a less attractive candidate for the formation of contact plugs, which are in direct contact with respective contact regions of the circuit elements. The contact plugs provide the electrical contact of the individual circuit elements to the first metallization layer, which is formed above an inter-layer dielectric material that encloses and passivates the circuit elements.

Consequently, in advanced semiconductor devices, the respective contact plugs are typically formed of a tungsten-based metal in an inter-layer dielectric stack, typically comprised of silicon dioxide, that is formed above a so-called contact etch stop layer, which may typically be formed of silicon nitride. Due to the ongoing shrinkage of feature sizes, however, the respective contact plugs have to be formed within respective contact openings with an aspect ratio which may be as high as approximately 10:1 or more, wherein a diameter of the respective contact openings may be about 80 nm or even less for transistor devices of the 45 nm technology and beyond. The aspect ratio of such openings is generally defined as the ratio of the depth of the opening to the width of the opening. Sophisticated etch and deposition techniques may be required for forming the contact plugs, as will be described with reference to FIGS. 1a-1c in more detail.

Figure 1A:
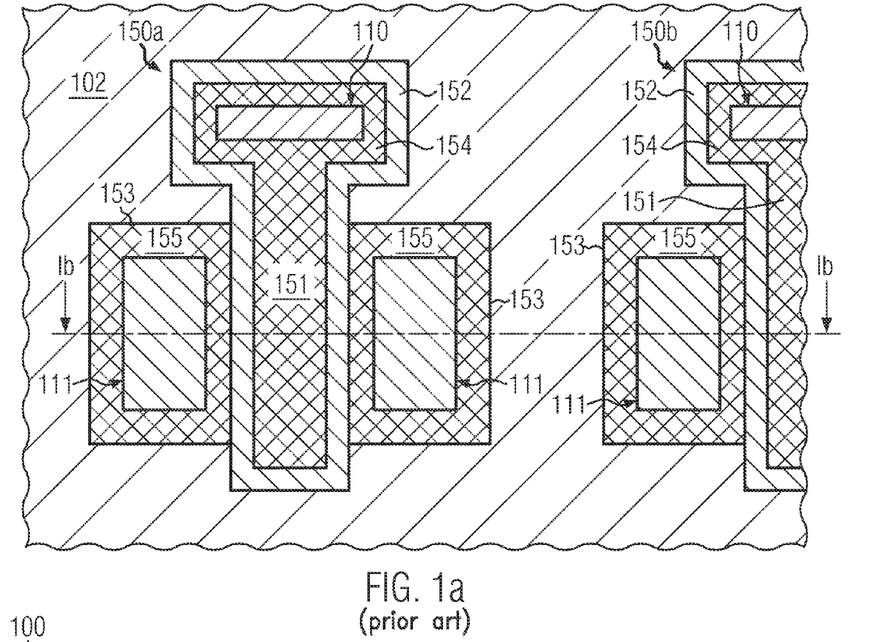
FIG. 1a schematically illustrates a top view of a semiconductor device comprising contact elements that connect to a gate electrode structure and to drain or source regions, according to conventional techniques.

FIG. 1a schematically illustrates a top view of a portion of a semiconductor device 100. The semiconductor device 100 comprises a substrate (not shown in FIG. 1a, 101 in FIG. 1b) above which is formed a semiconductor layer in and above which circuit elements, such as transistors, capacitors, resistors and the like, are formed. For convenience, circuit elements in the form of transistors 150a, 150b are illustrated, wherein transistor 150b is illustrated partially. The transistors 150a, 150b may comprise a gate electrode structure 151, sidewalls of which may be covered by a spacer element 152. Drain and source regions 153 are provided laterally adjacent to the gate electrode structures 151, which may be, in addition to a channel region, located below the gate electrode structures 151 and may represent an active region in the corresponding semiconductor layer. The active region may be defined by an isolation structure 102, above which also a portion of the gate electrode structures 151 may be positioned, thereby defining a gate contact region 154 which is connected to a contact plug or contact element 110 formed thereon. Similarly, contact elements 111 may be provided above contact regions 155 formed in the drain or source regions to improve the electrical characteristic of the contact. Therefore, the contact regions 155 typically comprise silicide material. It should be appreciated that the contact elements 110, 111 are typically formed in an appropriate interlayer dielectric material which, for convenience, is not shown in FIG. 1a.

Figure 1B:
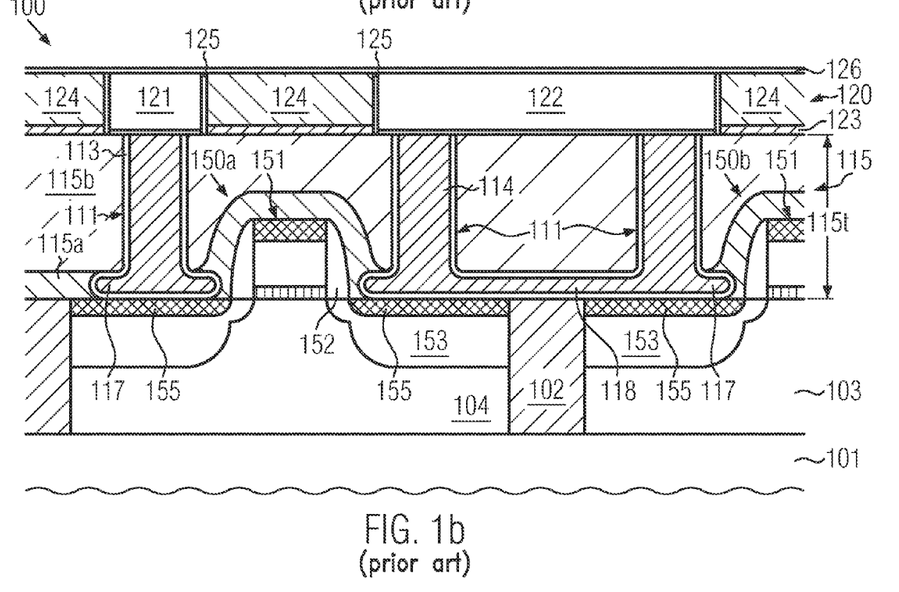
FIG. 1b schematically illustrates a cross-sectional view along the line Ib of FIG. 1a in a further advanced manufacturing stage.

FIG. 1b schematically illustrates a cross-sectional view along the line Ib as shown in FIG. 1a, wherein the semiconductor device 100 is illustrated in a further advanced manufacturing stage. As shown, the semiconductor device 100 comprises a substrate 101 which represents any appropriate carrier material, such as a silicon substrate, a silicon-on-insulator (SOI) substrate and the like. A silicon-based semiconductor layer 103 is formed above the substrate 101. The isolation structure 102, for instance in the form of a trench isolation, defines the active region 104 in which the drain and source regions 153 are positioned, i.e., respective dopant concentrations, so as to define respective PN junctions with the remaining portion of the active region 104. Furthermore, metal silicide regions may be formed in the drain and source regions 153, thereby defining a contact region 155 thereof, and on the gate electrode structure 151, thereby defining a respective contact region 154 (FIG. 1a) for contacting the gate electrode structure 151. The metal silicide may comprise, e.g., cobalt, titanium, nickel and the like. Furthermore, the semiconductor device comprises an interlayer dielectric material 115 which typically comprises two or more dielectric layers, such as the layer 115a, which may represent a contact etch stop layer comprised of silicon nitride, and a second dielectric material 115b, for instance provided in the form of a silicon dioxide material. Typically, a thickness 115t of the interlayer dielectric material 115 is in the range of several hundred nanometers (nm) so as to obtain a sufficient distance between the gate electrode structure 151 and a first metallization layer 120 in order to maintain the parasitic capacitance at a required low level. Consequently, the contact element 111 connecting to the drain or source contact region 155 may have a moderately high aspect ratio, since the lateral size thereof is substantially restricted by the lateral dimension of the drain and source regions 153, while the depth of the contact element 111 is determined by the thickness 115t of the interlayer dielectric material 115. On the other hand, the contact element 110 (FIG. 1a) merely has to extend down to the top surface of the gate electrode structure 151, i.e., to the contact portion 154, while also the lateral dimension of the contact element 110 may be different compared to the element 111, depending on the size and shape of the contact portion 154. The contact elements 110, 111 typically may comprise a barrier layer 113, e.g., in the form of a titanium liner, followed by a titanium nitride liner, while the actual fill material 114 may be provided in the form of a tungsten material.

The metallization layer 120 typically comprises an etch stop layer 123, for instance in the form of silicon nitride, silicon carbide, nitrogen-enriched silicon carbide and the like, on which may be formed an appropriate dielectric material 124, such as a low-k dielectric material having a relative permittivity of 3.0 or less. Moreover, respective metal lines 121, 122 are formed in the dielectric material 124 and connected to the contact elements 111, 110, respectively. The metal lines 121, 122 may comprise a copper-containing metal in combination with an appropriate barrier material 125, such as a material comprising tantalum, tantalum nitride and the like. Finally, a cap layer 126 is typically provided so as to confine the copper material in the metal lines 121, 122, which may be accomplished on the basis of dielectric materials such as silicon nitride, silicon carbide and the like.

A typical process flow for forming the semiconductor device 100 as shown in FIG. 1b may comprise the following processes. After forming the circuit elements 150a, 150b on the basis of well-established techniques in accordance with design rules of the respective technology node, which includes forming an appropriate gate insulation layer and patterning the same along with the gate electrode structure 151 by sophisticated lithography and etch techniques. The drain and source regions 153 may be formed by ion implantation, using the spacer structure 152 as an appropriate implantation mask. After any anneal cycles, the metal silicide of the contact regions 154, 155 are formed and the interlayer dielectric material is deposited, for instance, by forming the contact etch stop layer 115a, followed by the deposition of silicon dioxide material on the basis of plasma enhanced chemical vapor deposition (CVD) techniques. After planarizing the resulting surface topography of the silicon dioxide material, a photolithography sequence may be performed on the basis of well-established recipes, followed by anisotropic etch techniques for forming contact openings extending through the interlayer dielectric material 115 so as to connect to the contact region 154 (FIG. 1a) of the gate electrode structure 151 and to the contact region 155 of the drain and source regions 153. During the respective etch process, sophisticated patterning regimes may be required due to the high aspect ratio of the corresponding contact opening, in particular for the contact element 111. During the complex etch sequence, the layer 115a may be used as an etch stop layer for etching the silicon dioxide material 115b, after which a further etch process, e.g., an anisotropic reactive ion etch process, may be performed in order to finally expose the contact regions of the drain and source regions 153 and of the gate electrode structure 151, i.e., the metal silicide regions 154, 155. Generally, a certain amount of over-etching is required in this etch step to reliably remove the material of the contact etch stop layer 115a in the contact region. Afterwards, typically, a wet chemical cleaning process is performed to clean the sidewalls of the obtained openings and the silicide surface at the bottom of the opening. As is well known, during complex plasma assisted etch processes, a plurality of etch by-products may be generated, at least some of which may also deposit on exposed surface areas and which may have to be removed prior to a subsequent deposition of material, such as a conductive barrier material, within the contact opening. Consequently, respective wet chemical etch recipes may be applied, such as diluted hydrofluoric acid, ammonia peroxide mixtures and the like, which are appropriate to serve as efficient recipes for conditioning exposed surface portions prior to the further processing of the device 100.

Next, the barrier layer 113 may be formed on the basis of, for instance, physical vapor deposition (PVD), such as sputter deposition. The term "sputtering" describes a mechanism in which atoms are ejected from a surface of a target material that is itself hit by sufficiently energetic particles. Sputtering has become a frequently used technique for depositing tantalum, titanium, tantalum nitride, titanium nitride and the like due to the superior characteristics compared to, for instance, CVD techniques with respect to controlling layer thickness. Additionally, exposed surfaces may inherently be cleaned by performing a sputtering without providing a deposition species. Barrier layer 113 may comprise a titanium nitride liner and a titanium layer formed thereon by sputter deposition so as to accomplish a reliable coverage of all exposed surface portions of the contact opening. The titanium nitride liner may enhance the adhesion of the titanium layer, thereby enhancing the overall mechanical stability of the contact elements 110, 111. Thereafter, the tungsten material 114 may be deposited by CVD in which tungsten hexafluorine ($WF_6$) is reduced in a thermally activated first step on the basis of silane and is then converted into tungsten in a second step on the basis of hydrogen. During the reduction of the tungsten on the basis of hydrogen, a direct contact to silicon dioxide of the layer 115b is substantially prevented by the barrier layer 113 in order to avoid undue silicon consumption of the silicon dioxide.

Thereafter, the metallization layer 120 may be formed by depositing the etch stop layer 123 followed by the deposition of the dielectric material 124. Next, respective trenches are formed in the dielectric material 124 according to well-established single damascene strategies. Next, metal lines 121, 122 may be formed by depositing a barrier layer 125 and filling in a copper-based material, for instance on the basis of electroplating, which may be preceded by the deposition of a copper seed layer. Finally, any excess material may be removed, for instance, by chemical mechanical polishing (CMP), and the cap layer 126 may be deposited.

Subsequently, the device may be accomplished by adding further metallization layers and a contact pad layer providing a bond pad layout allowing for connecting the device to an appropriate carrier substrate providing a corresponding bond pad layout.

The conventional contact plug manufacturing process as described above provides reliable contacts for devices having a sufficient contact spacing. In semiconductor devices of the 45 nm technology, and in particular of the 32 nm technology, however, the conventional contact plug manufacturing process is considered as adversely affecting the device performance or even as substantially contributing to the overall yield loss as the inventors recognized that contact extensions 117 may be formed which may even cause shorts 118 between neighboring contacts 111.

Due to the ongoing shrinkage of feature sizes, not only the dimensions of the respective contact plugs are reduced as set forth above but also the distance to neighboring contacts and to adjacent gate electrodes. The latter is of particular relevance in regions of semiconductor devices which may comprise a plurality of closely spaced transistors. A typical spacing (gate pitch) of closely spaced transistors for devices of the 45 nm technology is approximately 160 nm and approximately 120 nm for devices of the 32 nm node.

Figure 1C:
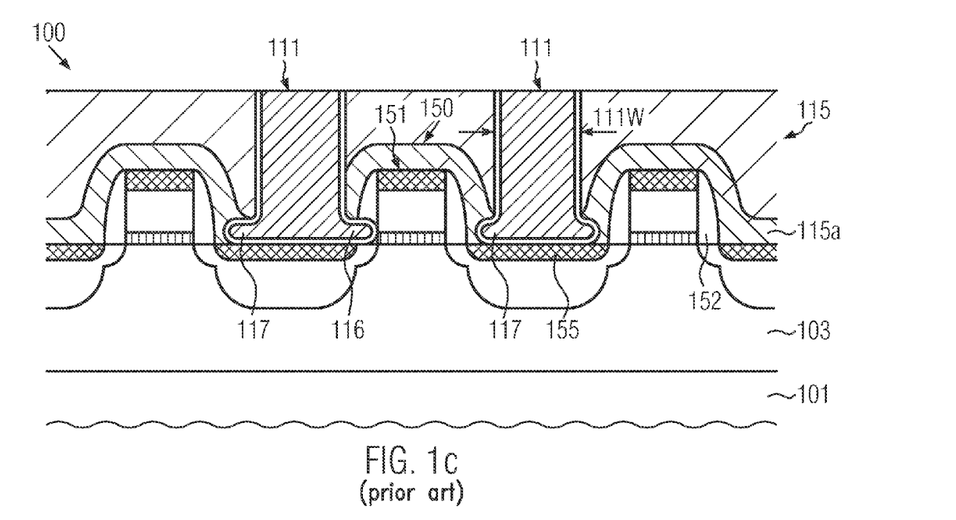
FIG. 1c schematically illustrates a plurality of closely spaced gate electrode structures and contact elements formed therebetween on the basis of a conventional process strategy.

FIG. 1c schematically illustrates a cross-sectional view in which the semiconductor device 100 may comprise a plurality of closely spaced transistors 150, each of which may comprise a corresponding gate electrode structure 151, as described above with reference to FIGS. 1a and 1b. The transistors 150 may be contacted by means of the contact elements 111, wherein, in sophisticated applications, the lateral dimension 111w of these contact elements is comparable to the space between the closely spaced gate electrode structures 151 including the spacer elements 152 and the contact etch stop layer 115a. Thus, in particular, the risk of formation of shorts 116 to gate electrode structures 151—which may substantially contribute to the overall yield loss—is increased in regions of semiconductor devices which may comprise a plurality of closely spaced transistors of the 45 and 32 nm technology and in particular following technologies having a gate spacing of 100 nm or even less.

Consequently, providing the conventional contact elements 111 may result in significant yield losses due to the formation of contact extension regions 117 and shorts 116, 118 in sensitive device areas.

In view of the situation described above, the present disclosure relates to manufacturing techniques and semiconductor devices in which formation of contact plugs does not unduly contribute to the overall yield loss.

SUMMARY OF THE INVENTION

The following presents a simplified invention of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques providing vertical contacts with superior shape, which provide a connection between metal lines of the very first metallization layer and contact regions, such as drain and source regions of field effect transistors. The superior shape of the contacts may be achieved by forming a protection layer on the sidewalls of the lower portion of the contact openings, in particular on the exposed sidewalls of the etch stop layer, by removing material of the contact region and re-depositing the removed material on the sidewalls of the lower portion of the opening in order to form a protection layer, avoiding formation of cavities in the etch stop layer in the wet clean steps required to prepare the contact openings for the subsequent contact plug fill processes. To this end, material of the contact region may be re-deposited on the sidewalls of the etch stop layer by a sputter process. In some illustrative embodiments disclosed herein, silicide material may provide an appropriate protection layer providing a sufficient resistance in the wet clean step in order to reduce formation of cavities in the edge stop layer and significantly reduce the overall device yield loss.

One illustrative method disclosed herein includes providing a device structure having a contact region. The method further includes forming a dielectric etch stop layer above the contact region and forming a dielectric layer above the etch stop layer. The method further includes etching an opening into the dielectric layer and etching the etch stop layer through the opening to expose the contact region at the bottom of the opening, performing a sputter process to remove material of the contact region and re-deposit the removed material on the sidewall of the opening.

A further illustrative method disclosed herein includes forming a silicide region and forming an etch stop layer above the silicide region. The method further includes forming a dielectric layer above the etch stop layer. Additionally, the method includes etching an opening into the dielectric layer using the etch stop layer as an etch stop and etching the etch stop layer through the opening to expose the silicide region at the bottom of the opening. Moreover, the method includes performing a redistribution process by re-depositing silicide material removed from the silicide region at the sidewall of the opening to form a silicide layer at least on an exposed sidewall of the etch stop layer.

One illustrative semiconductor device disclosed herein includes a silicide region arranged at least partially in a semiconductor layer, the silicide region providing a contact region. Furthermore, the semiconductor device includes an etch stop layer arranged above the semiconductor layer and a dielectric layer arranged above the etch stop layer. The semiconductor device further includes a contact structure comprising a conductive contact material, wherein the contact structure is formed in the dielectric layer and in the etch stop layer and extends to the silicide region. Moreover, the semiconductor device includes a silicide layer arranged at least between a sidewall of the etch stop layer and the contact structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides semiconductor devices and manufacturing techniques providing superior vertical contacts, which provide a connection between metal lines of the very first metallization layer and contact regions, such as gate electrode structures, drain and source regions, contact regions of resistors and capacitors and the like. The superior contacts may be achieved by forming a protection layer on the sidewalls of the etch stop layer of contact openings formed by an anisotropic etch process. The protection layer is formed prior to the required wet chemical cleaning step performed to clean the opening after the anisotropic etch process to protect the exposed sidewalls of the etch stop layer during the wet chemical cleaning step.

In the conventional manufacturing process, the wet chemical cleaning step is considered as causing cavities in the etch stop layer by removing material damaged in the preceding anisotropic plasma etch process. Using alternative cleaning processes to avoid the formation of cavities may concurrently reduce the cleaning effect. Furthermore, employing more resistant etch stop layer materials is not an appropriate option as the etch stop layers typically serve concurrently as a strain-inducing source to improve mobility of the charge carriers in the channel region of field effect transistors so that the material properties have to be optimized in this regard.

The protection layer may consequently avoid formation of cavities in the etch stop layer in the subsequent wet chemical cleaning step and may consequently avoid formation of contact extension regions extending into the etch stop layer in the subsequent plug fill processes without affecting the wet chemical cleaning step or without exacerbating the etch stop layer process requirements. The protection layer is formed by re-depositing material of the contact region, such as silicide, on the sidewalls of the contact openings, in particular on the exposed sidewalls of the etch stop layer. The material of the contact region may be re-deposited on the sidewalls of the etch stop layer by a back-sputter process. In some illustrative embodiments disclosed herein, silicide material, such as nickel silicide, may provide an appropriate protection layer, providing a sufficient resistance in the wet chemical cleaning step which is necessary for preparing the contact opening for a conventional contact fill process.

With reference to FIGS. 2a-2i, further illustrative embodiments will now be described in more detail, wherein reference may also be made to FIGS. 1a-1c, if required.

Figure 2A:
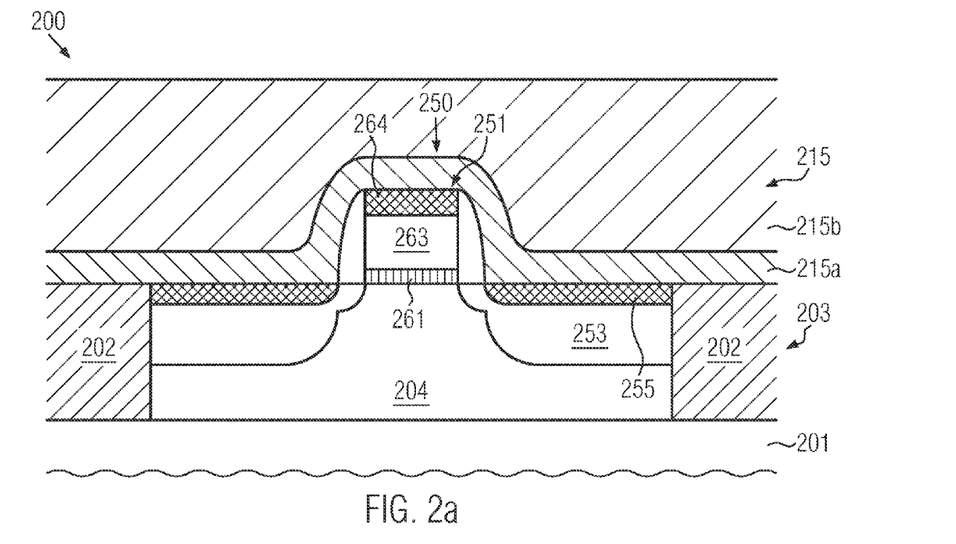
FIGS. 2a-2i schematically illustrate cross-sectional views of a semiconductor device during various manufacturing stages in forming sophisticated contact elements with superior shape by forming a protection layer on the sidewall of the etch stop layer, according to illustrative embodiments.

FIG. 2a schematically illustrates a cross sectional view of a semiconductor device 200 represented by a transistor 250. The semiconductor device comprises a substrate 201, above which may be formed a semiconductor layer 203. As previously discussed, the semiconductor layer 203 and the substrate 201 may represent an SOI configuration or a bulk configuration, depending on the overall design requirements. The semiconductor layer 203 may comprise silicon and/or germanium or compound semiconductors such as gallium arsenide or the like. Furthermore, the layer 203 may comprise a plurality of active regions 204 which may be laterally delineated by any isolation structure 202, as previously explained with reference to the semiconductor device 100. In the embodiment shown, a transistor element 250 may be formed in and above the semiconductor layer 203, i.e., within a corresponding semiconductor region or active region 204. The transistor element 250 may comprise a contact region 255, for instance, provided in the form of a metal silicide region and the like. In one embodiment, the contact region 255 is provided in the form of a nickel silicide region. It should be appreciated that the contact regions 255 may represent a portion of the drain and source regions 253, if the semiconductor device 200 is represented by a transistor 250. The contact regions 255 are to be contacted by means of appropriate contact elements which may thus provide an electrical connection between the contact region 255 and a metallization layer (not shown) still to be formed above the transistor 250. As illustrated, a dielectric material layer system 215 may be formed above the semiconductor layer 203 and thus above the contact regions 255. The dielectric material layer system 215 may comprise a first dielectric layer, such as layer 215a, which may represent a contact etch stop layer and a second dielectric layer 215b representing the main component of an interlayer dielectric layer 215 which may comprise, e.g., a silicon dioxide material. The etch stop layer 215a may comprise silicon nitride and may have a thickness in the range of approximately 10-15 nm. The etch stop layer 215a may additionally comprise an intrinsic strain that is appropriate to induce strain in the channel region of the transistor 250, in particular in the gate length direction, so that the charge carrier mobility in the channel region, and thus the resulting drive current of the transistor, may be accordingly increased. A tensile strained material of the etch stop layer 215a increases the mobility of electrons and thus the performance of N-channel transistors, whereas a compressive strain increases the performance of P-channel transistors.

In the embodiment shown, the transistor 250 comprises a gate electrode structure 251 which is formed on the active region 204 and which may have any appropriate configuration in terms of materials used therein, lateral dimensions and the like. For example, the gate electrode structure 251 may have a configuration as previously discussed with reference to the semiconductor device 100, when referring to the gate electrode structure 151. Depending on the design requirements, the gate electrode structure 251 may have a gate length of 40 nm and significantly less, while also the space between neighboring gate electrode structures may be on the same order of magnitude as previously described with reference to FIG. 1c.

The gate electrode structure may comprise a dielectric layer 261 that may comprise a silicon dioxide-based material or a high-k material having a dielectric constant of 10 and higher, which may be accomplished on the basis of materials such as hafnium oxide, zirconium oxide and the like, which are generally referred to hereinafter as high-k dielectric materials. The gate electrode structure 251 may further comprise a silicon-based electrode material 263. In particular, in combination with the high-k dielectric materials, the gate electrode structure may further comprise a metal-containing electrode material (not shown) provided above the high-k dielectric material. The gate electrode structure may further comprise a silicide layer 264 to improve the electrical conductivity of the gate electrode.

The strained etch stop layer 215a may be provided in combination with any gate electrode comprising a gate dielectric material based on silicon dioxide or a high-k material in case the high-k material is provided in an early manufacturing stage. The strained etch stop layer is typically not provided above high-k metal gate electrodes formed by a replacement gate approach.

The semiconductor device 200 as illustrated in FIG. 2a may be formed on the basis of similar process techniques as previously described with reference to the semiconductor device 100. For example, after completing the basic structure of the transistor 250 including the electrode structure 251, the dielectric material layer system may be formed, for instance, by depositing one or more dielectric materials based on any appropriate deposition technique. For example, the etch stop layer 215a, in particular if it is provided as a strained etch stop layer, may be deposited by a well-known plasma enhanced chemical vapor deposition (PECVD) process to form a silicon nitride layer having an intrinsic tensile or compressive strain of approximately 1 Gigapascal (GPa) or more. After deposition of the material system 215, a planarization process, such as a chemical mechanical polishing process, may be performed to provide the required surface planarity for the subsequent contact patterning process.

Figure 2B:
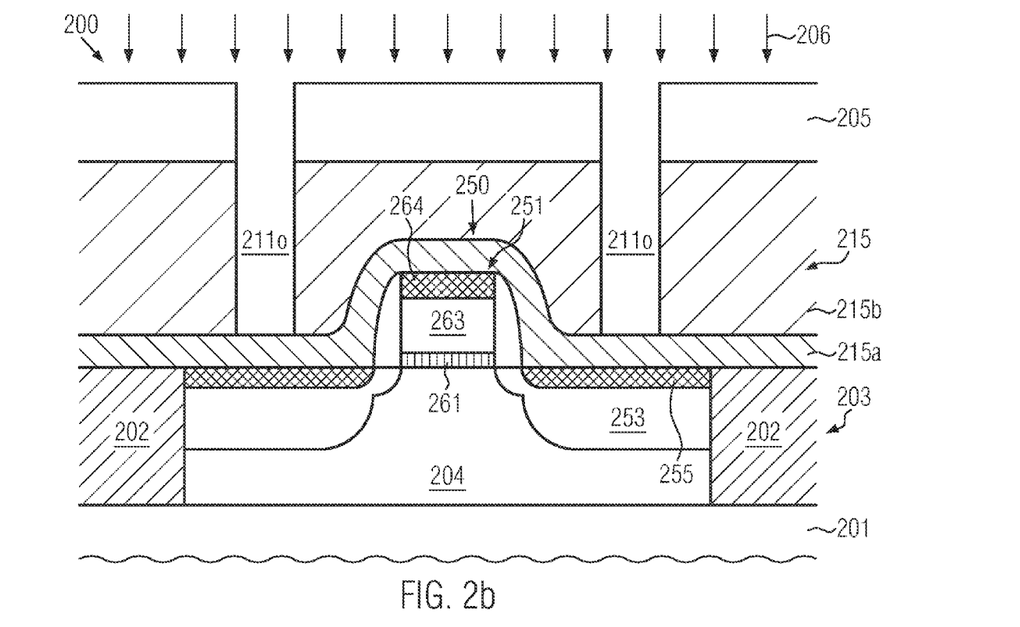

FIG. 2b schematically illustrates the semiconductor device 200 in a further advanced manufacturing stage after deposition and planarization of the material layer system 215. An appropriate patterning strategy may be applied in order to form vertical contact openings 211o with the required lateral dimensions in order to comply with the design requirements, for instance for densely packed device areas including the transistor 250. It should be appreciated that other contact openings may be formed so as to connect, for example, to contact regions of the gate electrode structures 251, as indicated by reference sign 154 in FIG. 1a, or to contact regions of capacitors or resistors.

The semiconductor device 200 as shown in FIG. 2b may be formed on the basis of similar process techniques as are described above with reference to the device 100. For example, the etch mask 205 may be formed in accordance with well-established patterning strategies and well-established process parameters may be used for the anisotropic etch process 206 exposing the etch stop layer 215a.

Figure 2C:
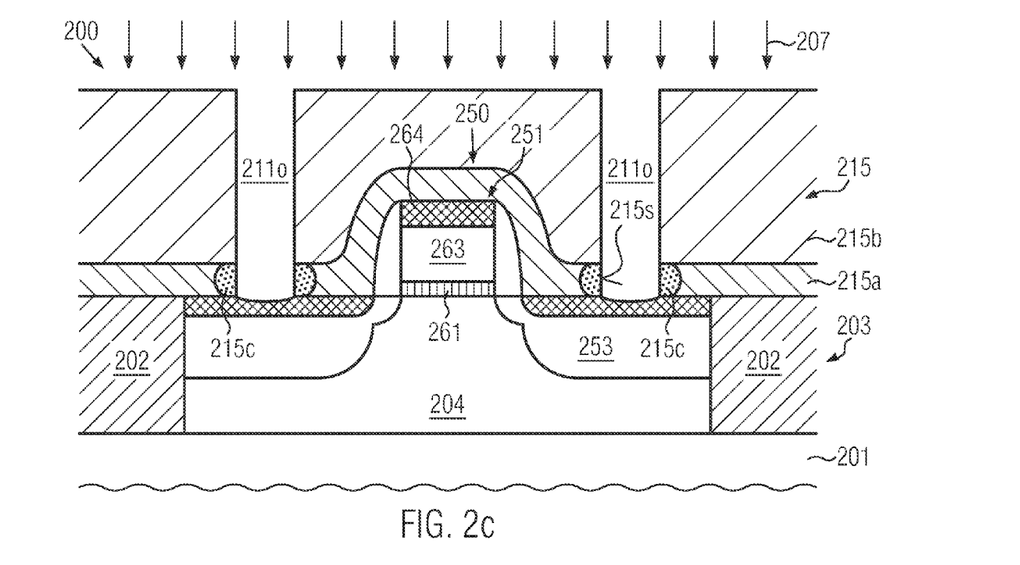

FIG. 2c schematically illustrates the semiconductor device 200 in a further advanced manufacturing stage in which an etch process 207 may be performed so as to etch through the etch stop layer 215a. The etch process 207 as shown in FIG. 2b may be performed in the same etch tool as the process 206 or may be established in a different etch tool, depending on the overall process strategy. For example, after etching through the dielectric layer 215b on the basis of well-established etch chemistries, the etch front may be stopped on or in the etch stop material 215a and subsequently the etch chemistry may be changed so as to etch through the etch stop layer 215a, which may be accomplished on the basis of well-established etch recipes, such as plasma etch recipes allowing for an appropriate anisotropic etch process. For instance, the etch stop material 215a may be comprised of silicon nitride, silicon carbide, nitrogen-containing silicon carbide, amorphous carbon or any other appropriate material composition, wherein, for each of these materials, well-established etch chemistries may be available. For instance, a fluorine-based etch chemistry may be used in order to efficiently etch through the material 215a. During the etch process 207, the etch front may attack the material of the contact region 255, however, with a significantly different etch rate depending on the overall process strategy. As previously discussed with reference to the device 100, typically the etch process 207 requires a certain amount of over-etching. During this over-etching, in particular the lower portions of the sidewalls of the contact opening 211o, i.e., substantially the exposed sidewalls 215s of the etch stop layer 215a are also attacked so that damaged regions 215c may be formed. Although the material of the etch stop layer 215a may be damaged in the regions 215c, the damaged material is substantially not removed during the etch process 207. As the conventional wet cleaning step is omitted at this manufacturing stage, the etch stop layer 215a is substantially maintained, even when damaged regions 215c are formed in the etch process 207.

Figure 2D:
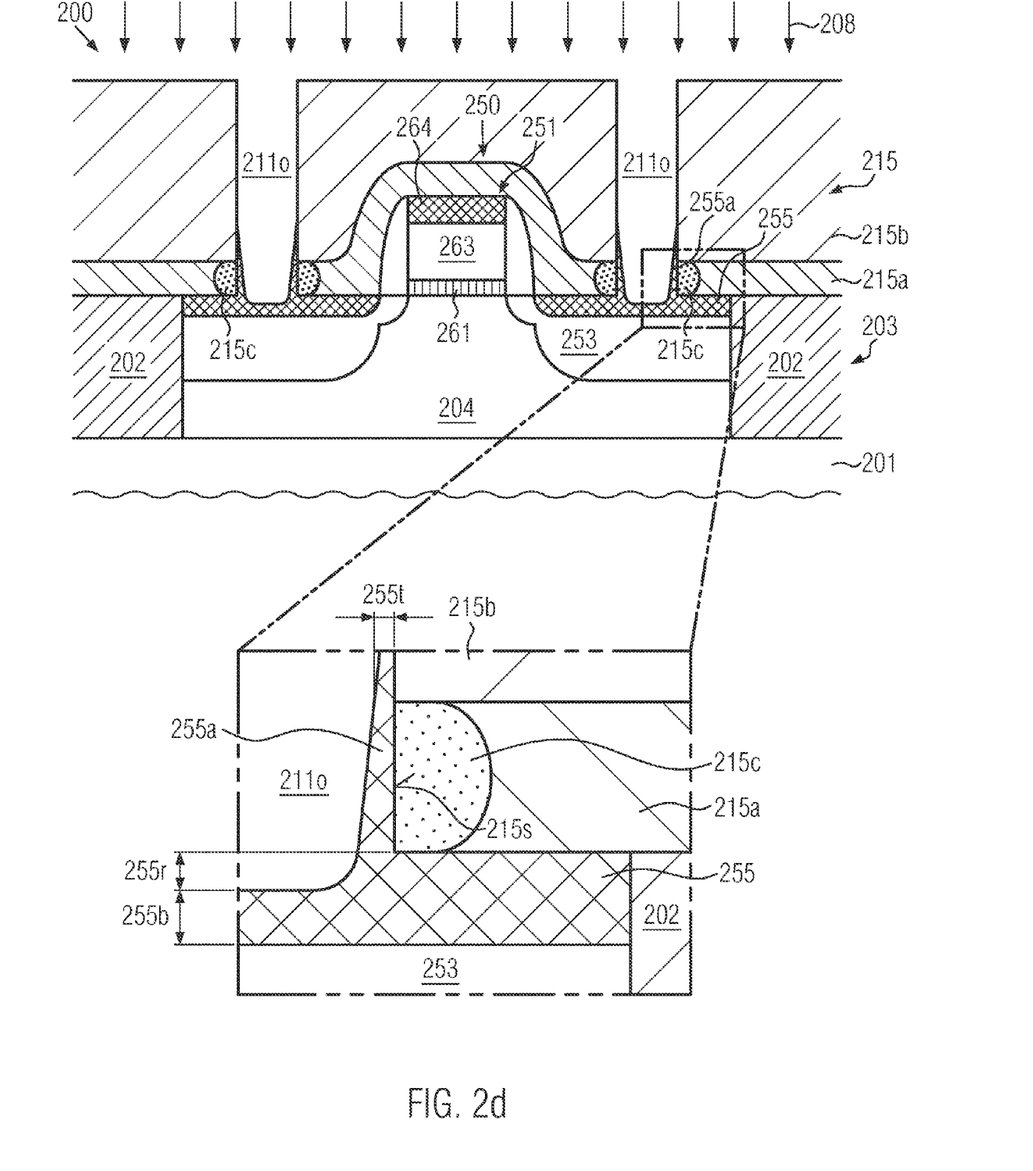

FIG. 2d schematically illustrates the semiconductor device 200 in an advanced manufacturing stage in which a redistribution process 208 is performed to remove material of the exposed contact region 255 and redeposit the material at the sidewalls of the contact opening 211o, in particular at the lower region to cover the exposed sidewalls 215s of the etch stop layer 215a so that a thin protection layer is formed thereon. In illustrative embodiments, the redistribution process 208 is performed on the basis of a back-sputter or re-sputter process providing an appropriate ion bombardment of an inert species such as, e.g., argon to sputter off respective portions of the material of the exposed surface region of the contact region 255. In illustrative embodiments, the contact region 255 comprises silicide material having a sufficient thickness to form an appropriate protection layer 255a, wherein sufficient silicide material remains at the bottom of the contact opening 211o to allow for forming of an appropriate ohmic source or drain contact exhibiting a desired low contact resistance, as depicted in the enlarged section of FIG. 2d.

Re-sputter processes are known in the prior art and are, in particular, employed for forming vias in metallization layers of semiconductor devices, wherein, e.g., material of a barrier layer formed in a via opening is removed from the bottom region and re-deposited on the sidewalls of the opening to improve the coverage of the barrier layer in the lower portion of the via opening. Appropriate parameters with respect to plasma power, bias power and the like may be readily determined on the basis of test runs with a subsequent inspection of the corresponding result of the re-sputter process. Sputter processes based on an inductively or a capacitively coupled plasma mode may be employed. In illustrative embodiments of the present invention, the parameters of the re-sputter process are determined so that an appropriate coverage of the sidewalls 215s of the etch stop layer 215a and hence of the damaged region 215c is obtained. In an illustrative embodiment based on an inductively coupled plasma mode, a pressure in the processing chamber may be in the range of approximately 1-5 mTorr, a high-frequency plasma power may be in the range of approximately 500-2000 W, a bias high-frequency power may be in the range of approximately 500-2000 W, and an argon gas flow may be in the range of approximately 20-100 sccm. In a further embodiment based on an inductively coupled plasma mode, a pressure in the processing chamber may be approximately 2.5 mTorr, a high-frequency plasma power may be approximately 1000 W, a bias high-frequency power may be approximately 1000 W and an argon gas flow may be approximately 50 sccm.

In an illustrative embodiment, the minimal thickness 255t of the protection layer 255a on the exposed sidewall 215s of the damaged etch stop layer region 215c is approximately 1 nm or more. The protection layer 255a may be arranged substantially in the lower half of the sidewalls of the openings 211o, whereas the upper part is substantially not covered by the protection layer. As the protection layer substantially reduces the diameter of the opening only in the lower portion of the opening, the protection layer may facilitate the contact filling process or at least does not adversely affect the contact filling process. In an illustrative embodiment, the depth 255r of the recess in the silicide contact region 255 is in the range of approximately 2-20 nm. In a further embodiment, the depth 255r of the recess is in the range of approximately 5-15 nm. In one embodiment, the thickness 255b of the remaining silicide material at the bottom region of the contact 255 is in the range of approximately 2-10 nm.

Figure 2E:
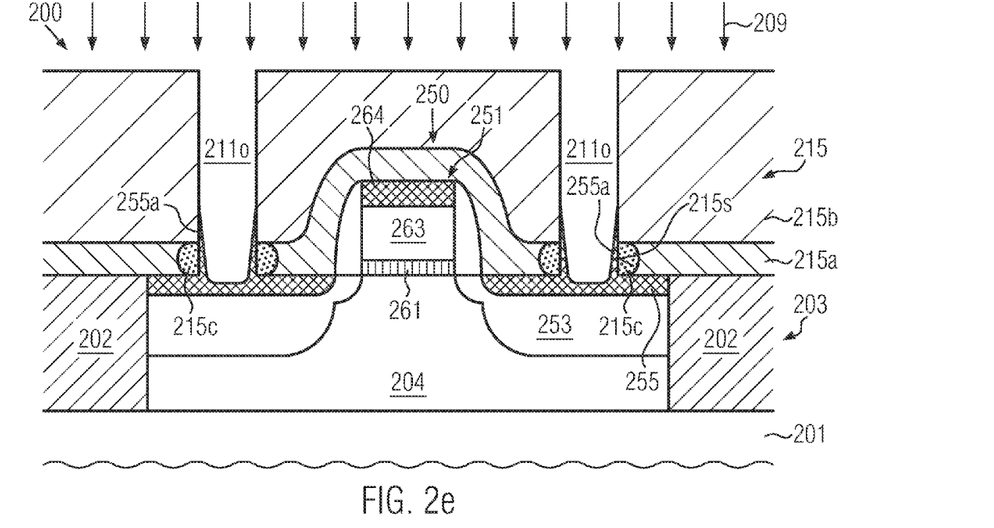

FIG. 2e schematically illustrates the semiconductor device 200 in a further advanced manufacturing stage, wherein a wet chemical cleaning process 209 is performed as described with reference to semiconductor device 100 to clean the surface of the contact opening 211o and to prepare the exposed surfaces for the subsequent contact formation. Due to the provision of the protection layer 255a covering the sidewalls 215s of the etch stop layer 215a, the wet clean chemistry does not attack the contact etch stop layer 215a, so that even damaged material of the etch stop layer 215a is not removed during the wet chemical cleaning process. Thus, any appropriate cleaning chemistry may be employed without adversely affecting the device performance.

Figure 2F:
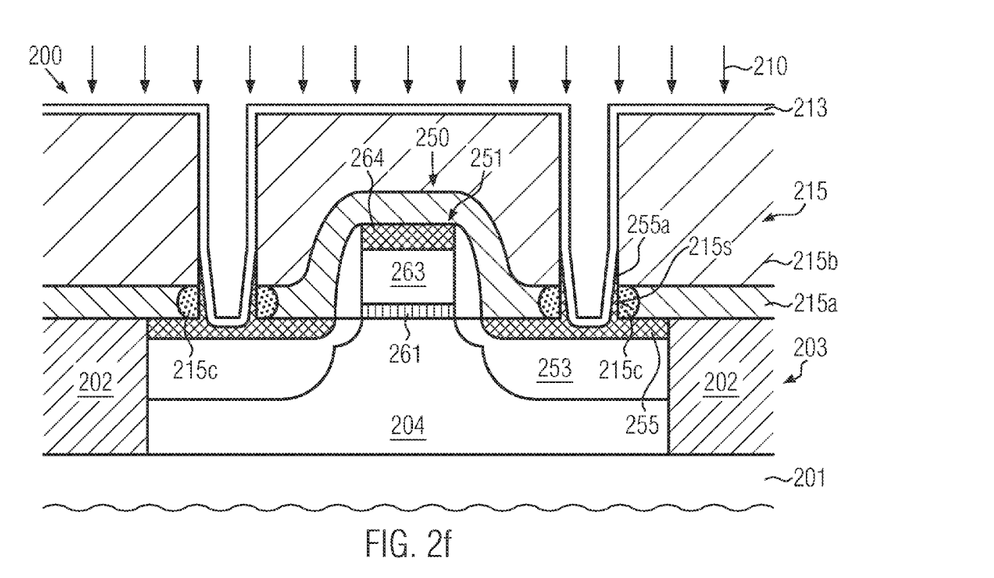

FIG. 2f schematically illustrates the semiconductor device 200 in an advanced manufacturing stage after the wet chemical cleaning process 209. The further processing may be continued by the deposition of a barrier layer 213 by an appropriate deposition process 210, e.g., by PVD. The barrier layer 213 may comprise two or more sub-layers (not shown). The barrier layer 213 may comprise, for example, a titanium nitride liner and a titanium layer deposited thereon. Sputtering has become a frequently used technique for depositing titanium, titanium nitride and the like due to the superior characteristics compared to, for instance, CVD techniques, with respect to controlling layer thickness. Additionally, exposed surfaces may inherently be cleaned by performing a sputtering without providing a deposition species, thus, prior to depositing the barrier layer, a corresponding cleaning sputter process may be additionally performed.

Figure 2G:
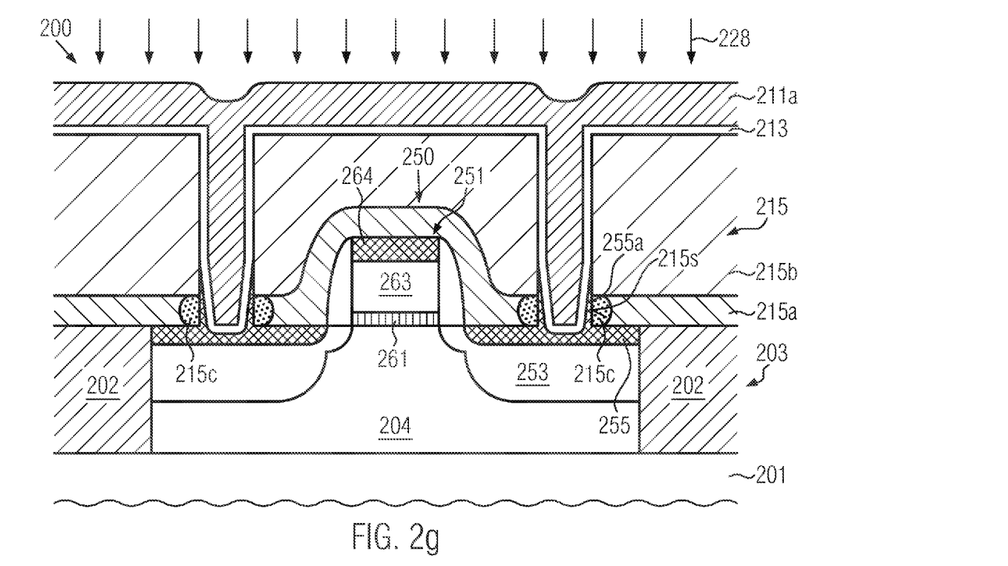

FIG. 2g schematically illustrates the semiconductor device 200 in a further advanced manufacturing stage in which a contact fill material 211a, such as, e.g., tungsten, is deposited by an appropriate deposition process 228. Tungsten may be deposited by CVD in which tungsten hexa fluorine ($WF_6$) is reduced in a thermally activated first step on the basis of silane and is then converted into tungsten in a second step on the basis of hydrogen. During the production of the tungsten on the basis of hydrogen, a direct contact of silicon dioxide of the layer 215b is substantially prevented by the titanium/titanium nitride liner 213 in order to avoid undue silicon consumption from the silicon dioxide layer 215b.

Figure 2H:
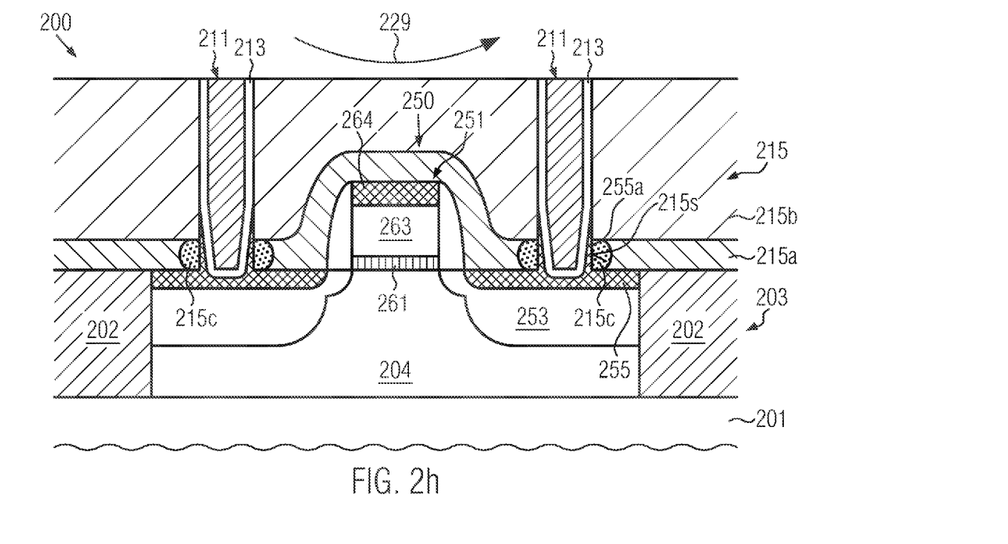

FIG. 2h schematically illustrates the semiconductor device 200 in a further advanced manufacturing stage in which a well-established CMP process 229 is performed to remove excess contact fill material 211a and material of the barrier layer 213 formed on the upper surface of dielectric layer 215b to finally define the contacts 211, wherein the barrier layer 213 may be used as a CMP stop layer in the contact material removal step.

Figure 2I:
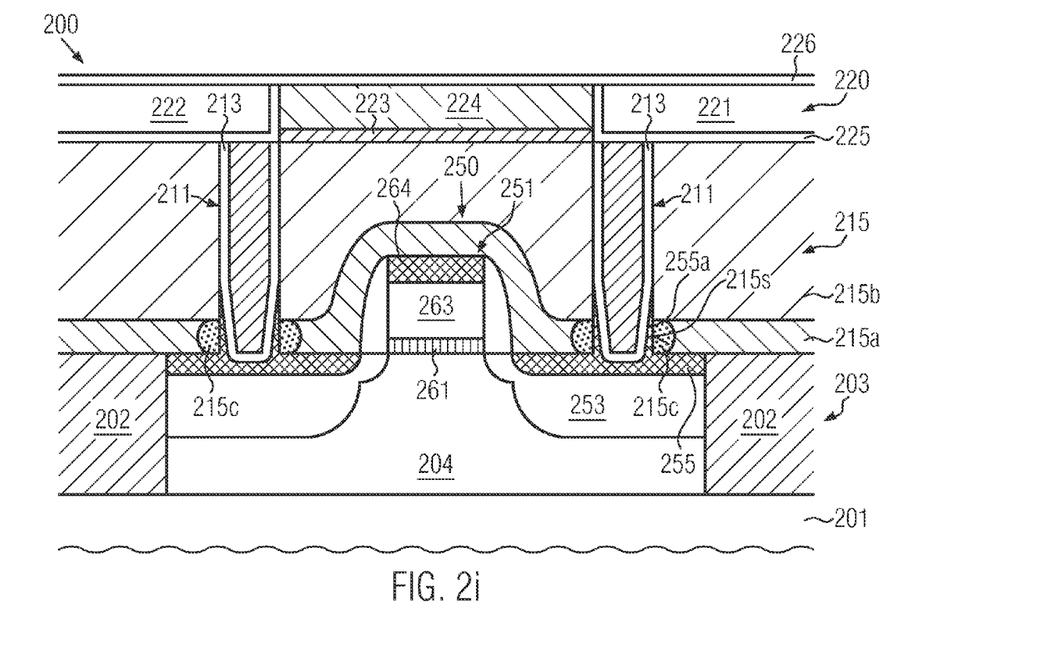

FIG. 2i schematically illustrates the semiconductor device 200 after formation of a first metallization layer 220 comprising an etch stop layer 223, an appropriate dielectric material 224, metal lines 221, 222 formed in the dielectric material 224, a barrier material 225 and a cap layer 226, as previously described with reference to semiconductor device 100. Subsequently, the device may be accomplished by forming further metallization layers and a contact pad layer, providing a bond pad layout allowing for connecting the device to an appropriate carrier substrate providing a corresponding bond pad layout, e.g., by a flip-chip bonding process.

As a result, the present disclosure provides semiconductor devices and manufacturing techniques in which the formation of shorts in a contact etch stop layer may be significantly reduced by forming a protection layer, such as a silicide layer, by means of material redistribution from a contact region exposed on the bottom of a contact opening at the sidewalls of the contact openings prior to performing a wet chemical cleaning process. Hence, the formation of contact extensions that may form shorts between adjacent contacts or between a contact and an adjacent gate electrode may be avoided or at least reduced so that the reliability of semiconductor devices comprising respective contact elements may be improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    providing a device structure comprising a contact region, said contact region comprising a contact region material;
    forming a dielectric etch stop layer above said contact region;
    forming a dielectric layer above said etch stop layer;
    etching an opening into said dielectric layer;
    etching said etch stop layer through said opening so as to expose said contact region material of said contact region at the bottom of said opening; and performing a back-sputter process to remove a portion of said contact region material from said exposed contact region and to re-deposit the removed contact region material within said opening, said re-deposited contact region material covering at least an entirety of exposed sidewalls of said etch stop layer.

2. The method of claim 1, further comprising performing a wet chemical cleaning process to remove etch by-products from sidewalls of said opening after performing said back-sputter process.

3. The method of claim 1, further comprising filling said opening with a conductive contact material.

4. The method of claim 2, wherein said re-deposited contact region material forms a protection layer on said exposed sidewalls of said etch stop layer that protects said etch stop layer during said wet chemical cleaning process.

5. The method of claim 4, wherein said contact region material and said protection layer comprise a metal silicide.

6. The method of claim 3, wherein said conductive contact material comprises tungsten.

7. The method of claim 3, further comprising forming a barrier layer on said protection layer re-deposited contact region material prior to filling said opening with said conductive contact material.

8. The method of claim 1, wherein said device structure is a field effect transistor and said contact region is provided in at least one of a source region, drain region and a gate electrode of said field effect transistor.

9. The method of claim 1, wherein said etch stop layer comprises strained silicon nitride.

10. The method of claim 1, wherein said etch stop layer comprises an intrinsic strain in the range of approximately 1 Gigapascal or more.

11. The method of claim 1, wherein an etching process that is used to etch said etch stop layer through said opening creates an as-etched damaged region in said etch stop layer.

12. A method, comprising:
forming a silicide region;
forming an etch stop layer above said silicide region;
forming a dielectric layer above said etch stop layer;
etching an opening into said dielectric layer using said etch stop layer as an etch stop;
etching said etch stop layer through said opening so as to expose said silicide region; and
performing a redistribution process to remove silicide material from said exposed silicide region and to re-deposit said removed silicide material within said opening so as to form a silicide layer that covers at least an entirety of exposed sidewalls of said etch stop layer.

13. The method of claim 12, further comprising performing a wet chemical cleaning process to remove etch by-products from said sidewalls of said opening after performing said redistribution process.

14. The method of claim 13, wherein an etching process that is used to etch said etch stop layer through said opening creates an as-etched damaged region in said etch stop layer, said silicide layer protecting said as-etched damaged region from exposure to said wet chemical cleaning process.

15. The method of claim 12, wherein said redistribution process is a sputter back-sputter process.

16. The method of claim 12, further comprising filling said opening with a conductive contact material.

17. The method of claim 12, wherein said redistribution process is performed prior to exposing sidewalls of said opening to any wet chemical cleaning processes.

18. A method, comprising:
forming a contact region comprising a conductive material in one of a source region and a drain region of a semiconductor device;
after forming said contact region, forming a dielectric material layer system above said contact region, said dielectric material layer system comprising a first dielectric layer formed above said contact region and a second dielectric layer formed above said first dielectric layer;
performing one or more etching processes to form a contact opening through said dielectric material layer system, said contact opening exposing a portion of said contact region;
performing a material redistribution process to remove a portion of said conductive material from said contact region and to re-deposit said removed portion of said conductive material within said opening, said re-deposited conductive material substantially completely covering at least an entirety of sidewall surfaces of said first dielectric layer; and
performing a wet chemical cleaning process on exposed inside surfaces of said contact opening, said re-deposited conductive material protecting said at least said entirety of said sidewall surfaces of said first dielectric layer from exposure to said wet chemical cleaning process.

19. The method of claim 18, wherein at least one of said one or more etching processes creates an as-etched damaged material region in said first dielectric layer exposed by said contact opening, said re-deposited conductive material completely covering said as-etched damaged material region.

20. The method of claim 18, wherein said re-deposited conductive material comprises a protection layer that is formed so as to substantially cover a lower sidewall surface portion of said second dielectric layer and to substantially expose an upper sidewall surface portion of said second dielectric layer.

21. The method of claim 18, wherein said conductive material comprising said contact region is formed as a metal silicide material having a thickness in the range of approximately 4-30 nm.

22. The method of claim 18, wherein removing said portion of said conductive material from said contact region comprises forming a recess in said contact region, said recess having a depth in the range of approximately 2-20 nm.

23. The method of claim 18, wherein re-depositing said conductive material within said opening comprises forming a layer of re-deposited conductive material having a layer thickness of at least approximately 1 nm.

* * * * *